(12) United States Patent
Hashimoto

(10) Patent No.: US 11,265,495 B2
(45) Date of Patent: Mar. 1, 2022

(54) IMAGING DEVICE WITH USB PD-COMPLIANCE DETECTION BASED OPERATION

(71) Applicant: Panasonic Intellectual Property Management Co., Ltd., Osaka (JP)

(72) Inventor: Shingo Hashimoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/766,145

(22) PCT Filed: Aug. 23, 2019

(86) PCT No.: PCT/JP2019/033074
§ 371 (c)(1),
(2) Date: May 21, 2020

(87) PCT Pub. No.: WO2020/129303
PCT Pub. Date: Jun. 25, 2020

(65) Prior Publication Data
US 2021/0227161 A1    Jul. 22, 2021

(30) Foreign Application Priority Data
Dec. 19, 2018   (JP) .............................. JP2018-237559

(51) Int. Cl.
*H04N 5/374*       (2011.01)
*H01L 27/146*      (2006.01)
(Continued)

(52) U.S. Cl.
CPC ....... *H04N 5/374* (2013.01); *H01L 27/14643* (2013.01); *H04N 5/343* (2013.01);
(Continued)

(58) Field of Classification Search
CPC ...... H04N 5/374; H04N 5/3698; H04N 5/343; H04N 5/23241; H04N 5/232411;
(Continued)

(56) References Cited

U.S. PATENT DOCUMENTS

2005/0013604 A1*  1/2005  Ogawa ............... G01R 31/3646
                                                396/279
2009/0109324 A1*  4/2009  Kaplan .............. H04N 21/4223
                                                348/372
(Continued)

FOREIGN PATENT DOCUMENTS

EP         2051157 A1    4/2009
JP         H06-178452 A  6/1994
(Continued)

OTHER PUBLICATIONS

International Search Report for corresponding Application No. PCT/JP2019/033074, dated Oct. 29, 2019.
(Continued)

*Primary Examiner* — Albert H Cutler
(74) *Attorney, Agent, or Firm* — Renner, Otto, Boisselle & Sklar, LLP

(57) ABSTRACT

An imaging device is an imaging device in and from which a battery can be fitted, the imaging device including a CMOS image sensor, a USB port, and a microcomputer. The CMOS image sensor images a subject. The USB port supplies power to the imaging device via a USB cable. The microcomputer detects whether or not the battery is fitted in the imaging device. The microcomputer enables an action of the CMOS image sensor by way of the power from the USB port when the battery is fitted in the imaging device. The microcomputer disables the action of the imaging unit that rely on the power from the USB port when the battery is not fitted in the imaging device.

11 Claims, 10 Drawing Sheets

(51) Int. Cl.
  *H04N 5/343* (2011.01)
  *H04N 5/369* (2011.01)
  *H04N 5/3745* (2011.01)
  *G03B 17/02* (2021.01)
  *G03B 17/18* (2021.01)
  *G03B 17/56* (2021.01)
  *H04N 5/232* (2006.01)

(52) U.S. Cl.
  CPC .......... *H04N 5/3698* (2013.01); *H04N 5/379* (2018.08); *H04N 5/37452* (2013.01)

(58) Field of Classification Search
  CPC .......... H04N 1/00885; H04N 1/00888; H04N 1/00891; H04N 1/00893; H04N 1/00896; H04N 1/00904; H04N 5/37452; H04N 5/379; H04N 5/232; H01L 27/14643; G03B 17/02; G03B 17/18; G03B 17/56
  See application file for complete search history.

(56) References Cited

U.S. PATENT DOCUMENTS

| | | | | |
|---|---|---|---|---|
| 2012/0062780 | A1* | 3/2012 | Morihisa | H04N 5/23212 348/333.13 |
| 2013/0182178 | A1* | 7/2013 | Shioji | H04N 5/23241 348/372 |
| 2018/0004694 | A1* | 1/2018 | Nemoto | G06F 13/4081 |
| 2018/0183340 | A1 | 6/2018 | Waters | |
| 2020/0106291 | A1* | 4/2020 | Inai | H02J 7/00 |
| 2020/0335995 | A1* | 10/2020 | Hasegawa | G03B 7/26 |

FOREIGN PATENT DOCUMENTS

| | | |
|---|---|---|
| JP | 2001-339630 A | 12/2001 |
| JP | 2003-015782 A | 1/2003 |
| JP | 2004-227381 A | 8/2004 |
| JP | 2005-328190 A | 11/2005 |
| JP | 2011-155705 A | 8/2011 |
| JP | 2013-080392 A | 5/2013 |
| JP | 2018013931 A | 1/2018 |

OTHER PUBLICATIONS

Extended European Search Report for corresponding Application No. 19874764.4, dated Oct. 20, 2020.

Office Action issued in corresponding Japanese Patent Application No. 2020-520684, dated Jun. 1, 2021.

* cited by examiner

FIG. 3

| Connected device /with or without body battery  Operation | I. USB PD-compliant device | | | | II. Non-USB PD-compliant device | | | |
|---|---|---|---|---|---|---|---|---|
| | PC | | USB AC adapter | | PC | | USB AC adapter | |
| | With battery | Without battery | With battery | Without battery | With battery | Without battery | With battery | Without battery |
| A. Camera power source SW OFF | Charge | Not charge | Charge | Not charge | Charge | Not charge | Charge | Not charge |
| B. Camera power source SW ON | MASS/PTP Connection  Deliver power  Charge | – | Deliver power  Charge | – | MASS/PTP Connection  Deliver power  Not charge | – | Deliver power  Not charge | – |

IMAGING DEVICE WITH USB PD-COMPLIANCE DETECTION BASED OPERATION

TECHNICAL FIELD

The present disclosure relates to an imaging device in and from which a battery can be fitted and removed, and particularly relates to an imaging device that can receive a supply of power provided by USB power delivery (PD).

BACKGROUND ART

Electronic devices that can receive a supply of power provided via USB are known (for example, refer to Patent Literature 1).

SUMMARY OF INVENTION

Technical Problem

When a camera is connected to a device compliant with the USB PD specification (referred to below as a USB PD-compliant device), the camera is driven by a power supply from the device. Consequently, when a user pulls out a USB cable, the power supply from the device is cut off, and driving of the camera is stopped as long as there is no power supply from a battery. In particular, the user is often not aware of whether or not a battery is fitted in the camera, and pulling out the USB cable may unintentionally stop a function of the camera. When the driving of the camera stops while an image is being recorded on a recording medium, there is a possibility of data being damaged. When the driving of the camera stops during a firmware update, there is a possibility that a fault will occur in a program and the camera will be unable to start.

The present disclosure provides an imaging device which corresponds to the USB PD specification and can be safely supplied with power.

Solution to Problem

An imaging device of the present disclosure is an imaging device in and from which a battery can be fitted and removed, the imaging device comprising an imaging unit, a power supply terminal, and a controller. The imaging unit is configured to image a subject. The power supply terminal is configured to supply power to the imaging device via a USB cable. The controller is configured to detect whether or not the battery is fitted in the imaging device. The controller is configured to enable an action of the imaging unit by means of the power from the power supply terminal when the battery is fitted in the imaging device, and disable the action of the imaging unit that rely on the power from the power supply terminal when the battery is not fitted in the imaging device.

The phrase "enables actions of the imaging unit" does not necessarily mean that the imaging unit is actually actuated, and could also mean that the imaging unit is capable of activating even while stopped.

According to the imaging device of the present disclosure, a supply of power can be safely received in an imaging device compliant with the USB PD specification.

BRIEF DESCRIPTION OF DRAWINGS

FIG. 3 is a table detailing actions that can be carried out by the imaging device compliant with a connected device in Embodiment 1;

FIG. 6 is a diagram of a control flow for setting a power source of the imaging device to ON;

DESCRIPTION OF EMBODIMENTS

Embodiments are described in detail below with reference made to the drawings, as appropriate. There are cases of omitting descriptions that are more detailed than necessary. For example, there are cases of omitting detailed descriptions of matters that are already well-known, and repetitive descriptions of substantially identical configurations. This is to avoid unnecessary redundancy in the following descriptions, and to make comprehension easier for those skilled in the art. The inventors have provided the accompanying drawings and the following descriptions in order for those skilled in the art to sufficiently comprehend the present disclosure, and have not intended to thereby limit the scope of the disclosure as set forth in the claims.

Figure 9:
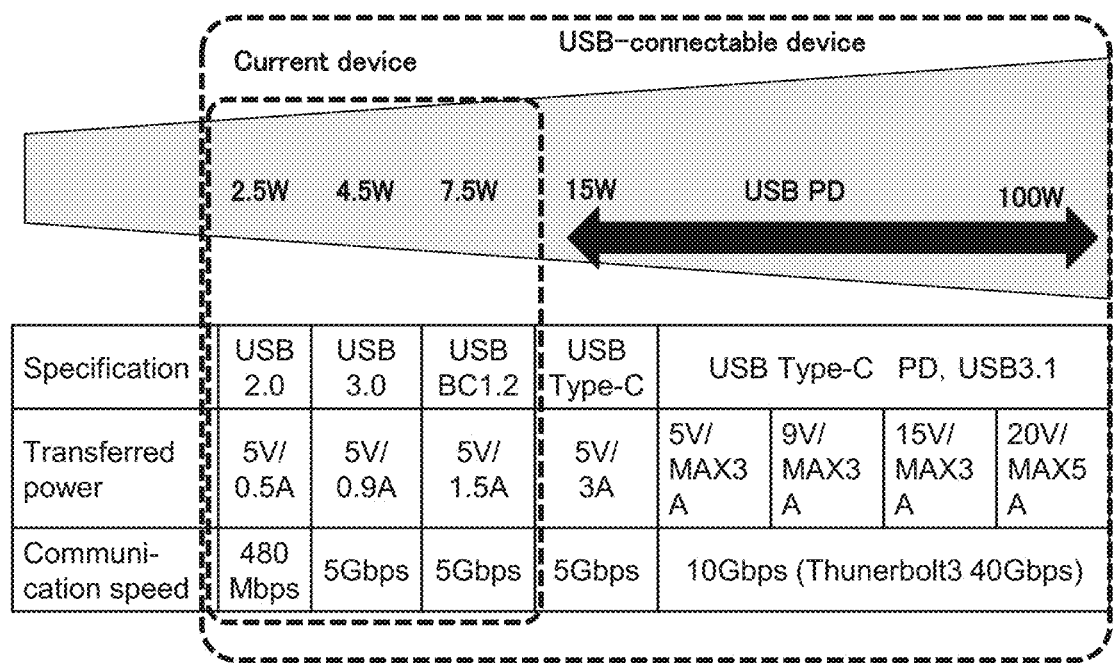
FIG. 9 is a table of power and communication speeds for USB-connectable devices of different specifications.

In the following descriptions, an external USB-connectable device and an imaging device can be connected via a USB cable having a plug complying with various USB specifications, which are shown in FIG. 9, and the plug is fitted in and removed from a USB port 16 of an imaging device (described hereinafter). A USB PD-compliant device, as shown in FIG. 9, is a device complying with the standard of being able to supply 15 W to 100 W, and is the first type of device to be able to simultaneously charge and deliver power (supply power for driving the imaging device), as is described hereinafter.

Among USB-connectable devices, current USB-connectable devices meet the specifications of USB 2.0, USB 3.0, and USB BC1.2, and these devices transfer power of approximately 5 V/0.5 A to 5 V/1.5 A, as shown in FIG. 9. However, such current USB-connectable devices are capable of supplying power at 7.5 W or less, and it has therefore not been possible to obtain sufficient power to drive all functions of an imaging device, even when the battery for the connected imaging device can be charged. A USB PD-compliant device can transfer power up to 100 W, as shown in FIG. 9. Therefore, in an imaging device connected to a USB PD-compliant device, not only will the battery be charged, but also drive power will be obtained.

Figure 10:
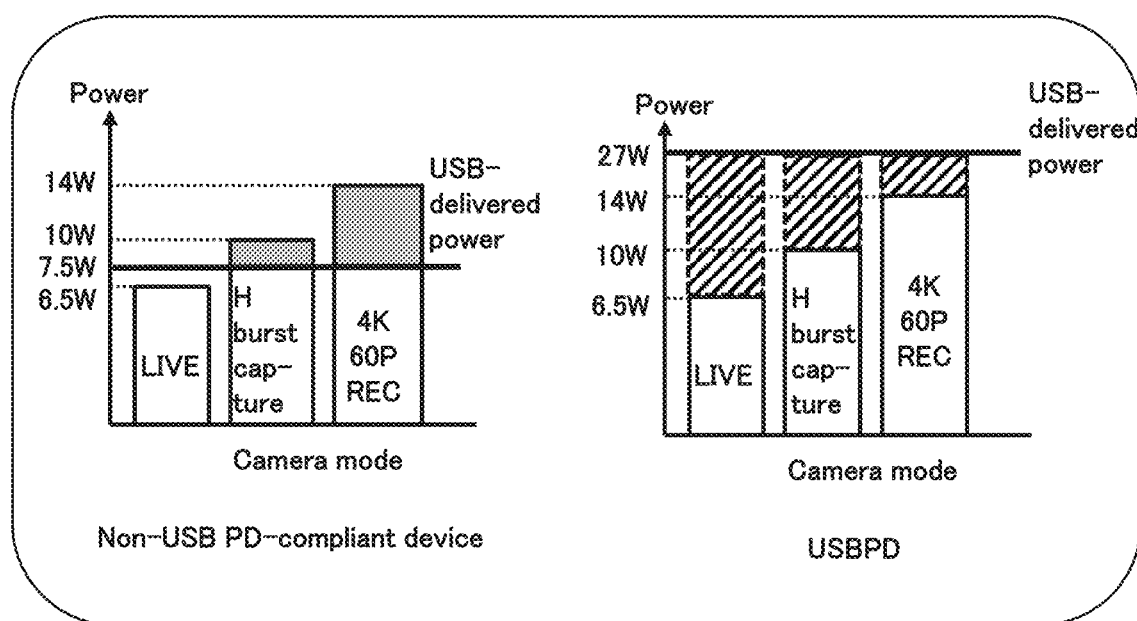
FIG. 10 is a graph comparing power that can be supplied with a USB PD-compliant device and a Non-USB PD-compliant device, relative to power consumption of the imaging device.

The driving of the imaging device consumes different amounts of power depending on an action mode of the imaging device. FIG. 10 is a graph that shows power consumption when main functions of an imaging device are carried out. Examples of the main functions include a live view (LIVE), high-speed burst capturing (H burst capturing), and recording a 4K image at a frame rate of 60 P (4 k60 P REC). The imaging device consumes about 10 W of power for high-speed burst capturing, and 14 W of power for 4 k60 P REC, as shown in FIG. 10. However, as is described above, in the case of a current USB-connectable device that is not a USB PD-compliant device (a Non-USB PD-compliant device), at most 7.5 W of power can be supplied, and these main functions of the imaging device therefore cannot be carried out with the transferred power from the current USB-connectable device. Consequently, the battery supplies the rest of the power needed (the gray parts in the left graph of FIG. 10) in addition to using transferred power from the Non-USB PD-compliant device. In this case, when a battery is not fitted or the battery has insufficient charge, the imaging device cannot be driven.

With a USB PD-compliant device, as shown in the right-hand graph of FIG. 10, not only is it possible to provide the drive power needed to carry out the main functions of the imaging device, excess power from the power delivery (slanted-line parts in the right-hand graph) can be used to charge the battery.

In light of the above, an imaging device according to the present disclosure shall be described.

1. Embodiment 1

An imaging device according to Embodiment 1 is described below with reference to FIGS. 1 to 7.

[1-1. Configuration]

Figure 1:
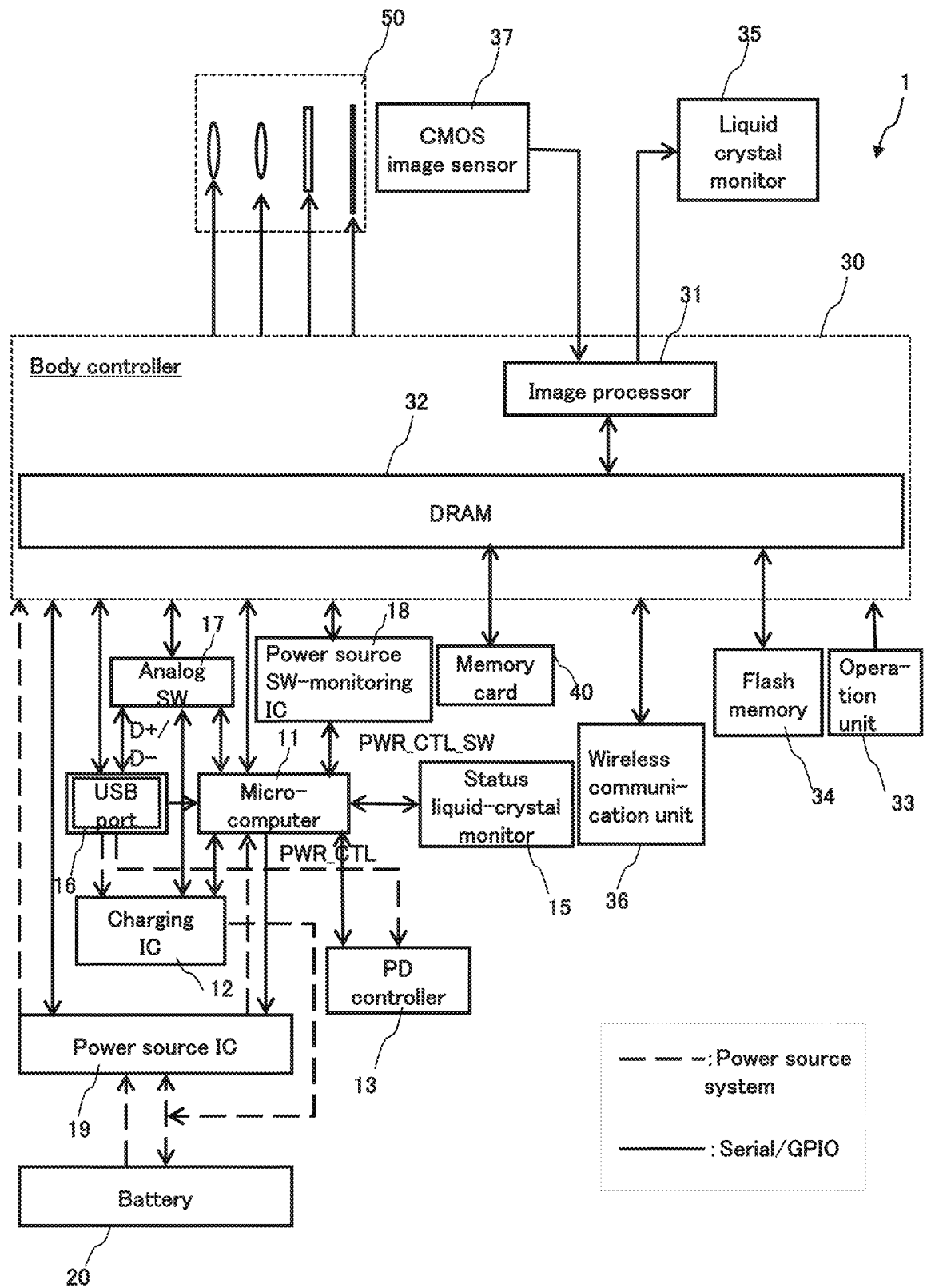
FIG. 1 is a diagram of an overall configuration of an imaging device according to Embodiment 1.

FIG. 1 shows an overall configuration of an imaging device 1 according to Embodiment 1. The imaging device 1 is, for example, an integrated-lens digital camera capable of imaging still images and/or moving images.

The imaging device 1 comprises a microcomputer 11, a charging integrated circuit (IC) 12, a PD controller 13, a status liquid-crystal monitor 15, a USB port 16, an analog switch 17, a power source switch-monitoring integrated circuit (IC) 18, a power source integrated circuit (IC) 19, and a battery 20. These components activate in a control of power supply to the imaging device 1, as is described hereinafter.

The imaging device 1 further comprises a body controller 30, an operation unit 33, a flash memory 34, a liquid crystal monitor 35, a wireless communication unit 36, a CMOS image sensor 37, and a memory card 40. The imaging device 1 also comprises an optical system 50 securely attached to a body of the imaging device. Through actions of the body controller 30, these components carry out the main functions of the imaging device 1. The main functions of the imaging device 1 include imaging, image processing, inputting/outputting image data, writing and/or reading of image data in a recording medium, update processing of firmware and other software, etc.

In FIG. 1, dashed-line arrows indicate a flow of a signal relating to power supply, and solid-line arrows indicate a flow of a serial signal or a parallel signal for other communications and/or controls. Functions of the components including signal exchange are described below.

The microcomputer 11 (one example of a controller) includes a CPU and/or a memory. The microcomputer 11 switches the analog switch 17 and inputs a D+/D− signal from the USB port 16 to the body controller 30, the microcomputer 11, or the charging IC 12. The microcomputer 11 obtains a result of a port determination from the charging IC 12. The microcomputer 11 also detects a signal (High signal or Low signal) generated in response to fitting and removing of the battery 20, and determines whether or not the battery 20 is fitted in. The microcomputer 11 acquires a remaining charge of the battery 20. For the remaining charge of the battery 20, for example, a voltage value of the battery 20 may be monitored by the power source IC 19, and the remaining charge of the battery 20 may be acquired in accordance with the voltage value.

The charging IC 12 controls the supply of power from the USB port 16. Through this control, power obtained from the USB port 16 is used to charge the battery 20 or start up the body controller 30 of the imaging device 1.

The charging IC 12 is also connected to the microcomputer 11, and the charging IC performs a port determination (described hereinafter). The port determination determines a type of the connected device. For example, the port determination determines if the connected device is a personal computer (PC), an AC adapter, etc.

The PD controller 13 performs negotiations with the connected device via a configuration channel (CC) terminal of the USB port 16. In the negotiations, a direction of power supply between the imaging device 1 and the connected device, a setting of current/voltage, roles of terminals, etc., are decided via the CC terminal, as described hereinafter. The microcomputer 11 determines whether or not the connected device is a USB PD-compliant device by acquiring the results of the negotiations from the PD controller 13.

The status liquid-crystal monitor 15 (one example of a display unit) is a display disposed on the body of the imaging device 1 (e.g., on an upper surface of the body), separately from the liquid crystal monitor 35. The status liquid-crystal monitor 15 displays messages, etc., that correspond to commands from the microcomputer 11.

The USB port 16 (one example of a power supply terminal) is a type C terminal, and is a connection terminal for connecting an external device and the imaging device 1 via a USB cable (not shown). The USB port 16 includes a VBUS terminal for a power source, a GND terminal, the above-described CC terminal, and/or a terminal for D+ and D− signals. The connected device has similar terminals, and pulls up a CC and monitors voltage of the CC terminal. The connected device supplies voltage to the VBUS upon detecting a pulling down of the CC on the imaging device 1 side. Power is thereby supplied to the imaging device 1 side.

The analog switch 17 is switched under control by the microcomputer 11, and the analog switch connects the USB port 16 to either the microcomputer 11, the body controller 30, or the charging IC 12. When there has been an input signal (D+, D−) from the USB port 16, the analog switch 17 connects the USB port 16 to the charging IC 12, and the charging IC 12 performs a port determination. When, as a result of the port determination, the connected device is, for example, a PC and the PC communicates with the imaging device 1, the analog switch 17 connects the USB port 16 to the body controller 30. After the connected device and the imaging device 1 have connected, when enumeration, which is an exchange of data for mutual authentication, is carried out and power from the VBUS is determined by the microcomputer 11, the analog switch 17 connects the USB port 16 to the microcomputer 11.

The power source switch-monitoring IC 18 is a circuit that monitors whether or not an operation to turn a power source switch (not shown) of the imaging device 1 from OFF to ON (referred to below as an ON operation) has been performed. When the power source switch has been operated to ON, the power source switch-monitoring IC 18 transmits a signal to the microcomputer 11 via a general-purpose input/output (GPIO) terminal.

When a battery 20 has been fitted, the power source IC 19 controls the supply of power from the battery 20. The power source IC 19 also performs execution and interruption of the supply of power to the body of the imaging device 1 in accordance with the power source switch of the imaging device 1 being operated ON and OFF.

The battery 20 supplies power for activating the imaging device 1. The battery 20 may be a primary battery or a secondary battery. The battery 200 may be an internal battery attached inside the body of the imaging device 1, or an external battery attached to an exterior of the body of the imaging device 1 by a battery grip, etc. There may be a plurality of batteries 20, and the plurality of batteries 20 may respectively include an internal battery and an external battery.

The body controller 30 is a computer device containing a CPU and a RAM and/or ROM and other memory. The body controller 30 controls the actions of the entire imaging device 1, including image processing, in accordance with instructions from the operation unit 33 and/or software written into the ROM. The body controller 30 communicates with the connected device through the USB port 16. For example, the body controller 30 communicates with the connected device during mass storage connection and/or tethered shooting.

The body controller 30 includes an image processor 31 and DRAM 32. The image processor 31 performs prescribed image processing on image data outputted from the CMOS image sensor 37. The prescribed image processing includes gamma correction processing, white balance correction processing, flaw correction processing, YC conversion processing, digital zoom processing, shrink processing, stretch processing, etc. The DRAM 32 is used as working memory of the body controller 30.

The body controller 30 may include, instead of a CPU, a processor configured from a dedicated electronic circuit designed so as to bring a prescribed function to effect. Specifically, the body controller 30 can be brought to effect with a CPU, a MPU, a GPU, a DSU, a FPGA, an ASIC, and other various processors. The body controller 30 may be configured from one or more processors. The body controller 30 may also be configured from one semiconductor chip together with the image processor 31, etc.

The operation unit 33 includes a release button, other types of buttons, a directional keypad, a dial, a touch panel disposed in the liquid crystal monitor 35, etc. The user causes the functions of the imaging device 1 to be carried out by operating the operation unit 33. The operation unit 33 includes the power source switch of the imaging device 1. When the power source switch is set to ON, the body controller 30 is able to start up and the main functions of the imaging device 1 can be carried out. When the power source switch is set to OFF, the body controller 30 does not start up and the main functions of the imaging device 1 cannot be carried out.

The flash memory 34 stores image data processed by the body controller 30. The flash memory 34 also stores programs and parameters used by the body controller 30.

The liquid crystal monitor 35 (one example of a display unit) is a display disposed on, for example, a rear surface of the body of the imaging device 1. The liquid crystal monitor 35 displays image data (still images or moving images) processed by the image processor 31. The liquid crystal monitor 35 displays a setting menu for setting actuating conditions of the imaging device 1. The liquid crystal monitor 35 may include a touch panel that functions as part of the operation unit 33. Instead of the liquid crystal monitor 35, an organic EL display or another display may be used.

The wireless communication unit 36 includes a WiFi- and/or Bluetooth-compliant communication module, and the body controller 30 performs bi-directional communication control with wirelessly connected devices. The communication module may use infrared communication, a wireless local area network (LAN), etc., and is preferably capable of connecting wirelessly with external devices.

The CMOS image sensor 37 (one example of an imaging unit) is an imaging element including a light-receiving element, an automatic gain control circuit, and an analog/digital converter. The light-receiving element converts a light signal concentrated by the optical system 50 to an electric signal, and outputs the electric signal. The automatic gain control circuit amplifies the electric signal outputted from the light-receiving element and outputs the amplified electric signal. The analog/digital converter converts the electric signal outputted from the automatic gain control circuit to a digital signal, and outputs the digital signal to the body controller 30. The CMOS image sensor 37 is controlled by a timing generator to carry out an action of imaging still and moving images, an action of imaging through images, a data-forwarding action, an electronic shutter action, etc. The image data generated by the CMOS image sensor 37 is sent to the image processor 31. Instead of the CMOS image sensor 37, an NMOS image sensor, a CCD image sensor, or another imaging element may be used.

The memory card 40 is fitted in a memory slot, the memory card internally including a semiconductor memory or another storage element. The memory card 40 stores image data. The body controller 30 reads the image data stored in the memory card 40, processes the read image data through the image processor 31, and displays the image data on the liquid crystal monitor 35. A plurality of memory cards 40, e.g., two, may be provided.

The optical system 50 is configured from a lens barrel and is securely attached to the body of the imaging device 1. The optical system 50 includes: a group of lenses including a focus lens, a zoom lens, etc.; a drive unit for the lenses; etc. The optical system 50 is controlled and driven by the body controller 30.

[1-2. Actions]

Figure 2:
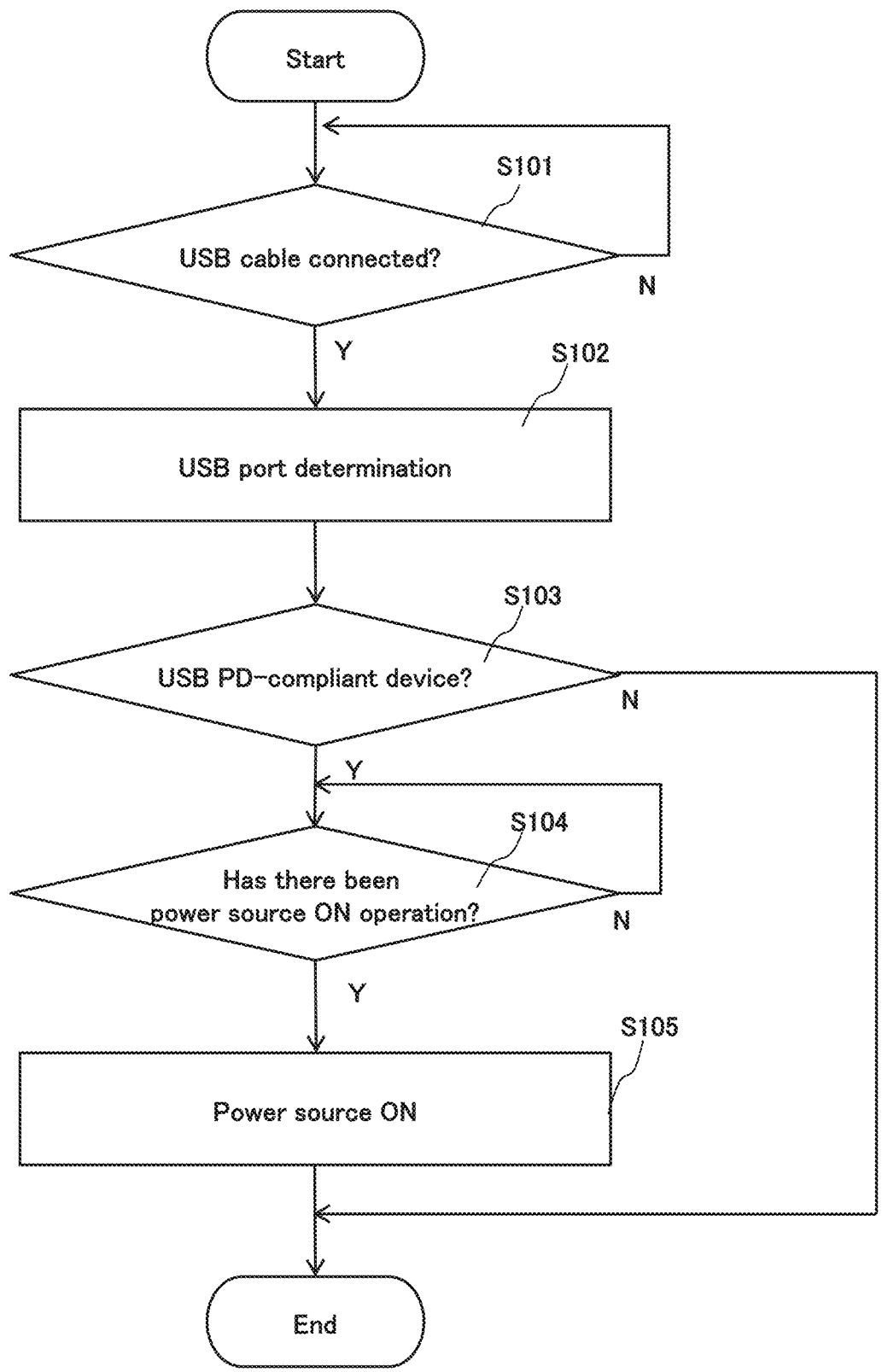
FIG. 2 is a flowchart of actions of an imaging device according to a comparative example.

FIG. 2 is a flowchart of a startup action of the body controller 30 carried out mainly by the microcomputer 11, according to a comparative example. In an initial state, the power source of the imaging device 1 is set to OFF, and the body controller 30 cannot activate.

A determination is made as to whether or not a USB cable is connected to the imaging device 1 (S101). The microcomputer 11 determines whether or not a USB cable is connected in accordance with a signal input of the USB port 16. When it has been determined that a USB cable is connected (Yes in S101), the microcomputer 11 performs a determination of the USB port 16 (S102). Specifically, the microcomputer 11 is connected to the charging IC 12, and the microcomputer determines the type of the device connected to the USB port 16 in accordance with a signal from the charging IC 12.

Next, the microcomputer 11 detects whether or not the device connected via the USB cable is a USB PD-compliant device (S103). Specifically, the PD controller 13 connected to the microcomputer 11 determines whether or not the connected device is a USB PD-compliant device by acquiring the results of the negotiations made via the CC terminal of the USB port 16, as is described hereinafter.

Figure 6:
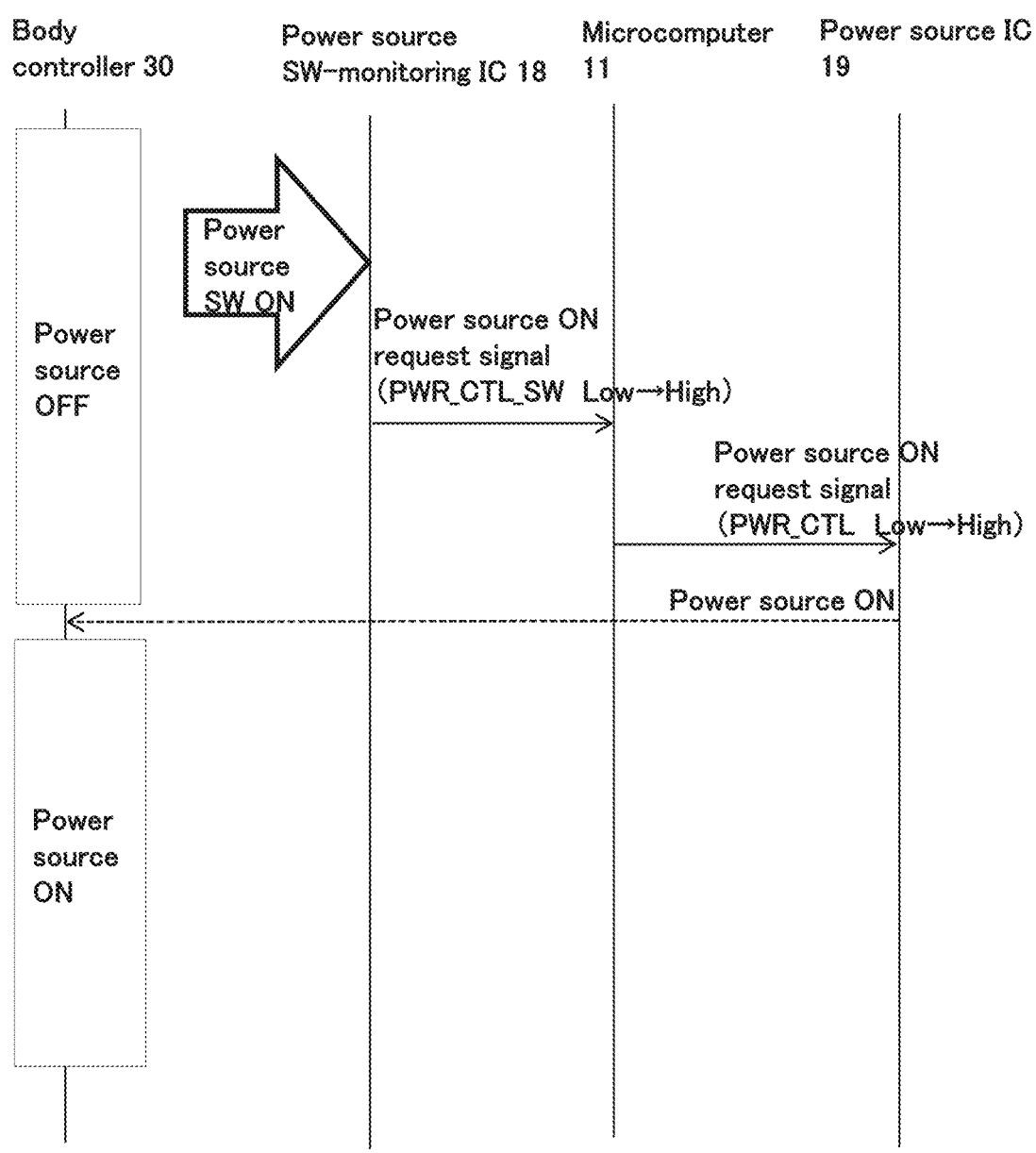

The microcomputer 11 then determines whether or not the power source switch of the imaging device 1 has been operated to ON (S104). This determination is performed as follows. Upon detecting that the power source switch has been operated to ON (Yes in S104), the power source switch-monitoring IC 18 transmits a power source ON request signal to the microcomputer 11, as shown in FIG. 6. The microcomputer 11 transmits the power source ON request signal to the power source IC 19, and the power source IC 19 turns ON the power source of the imaging device 1 (S105). As a result, the body controller 30 can start up and the main functions of the imaging device 1 can be carried out.

Figure 7:
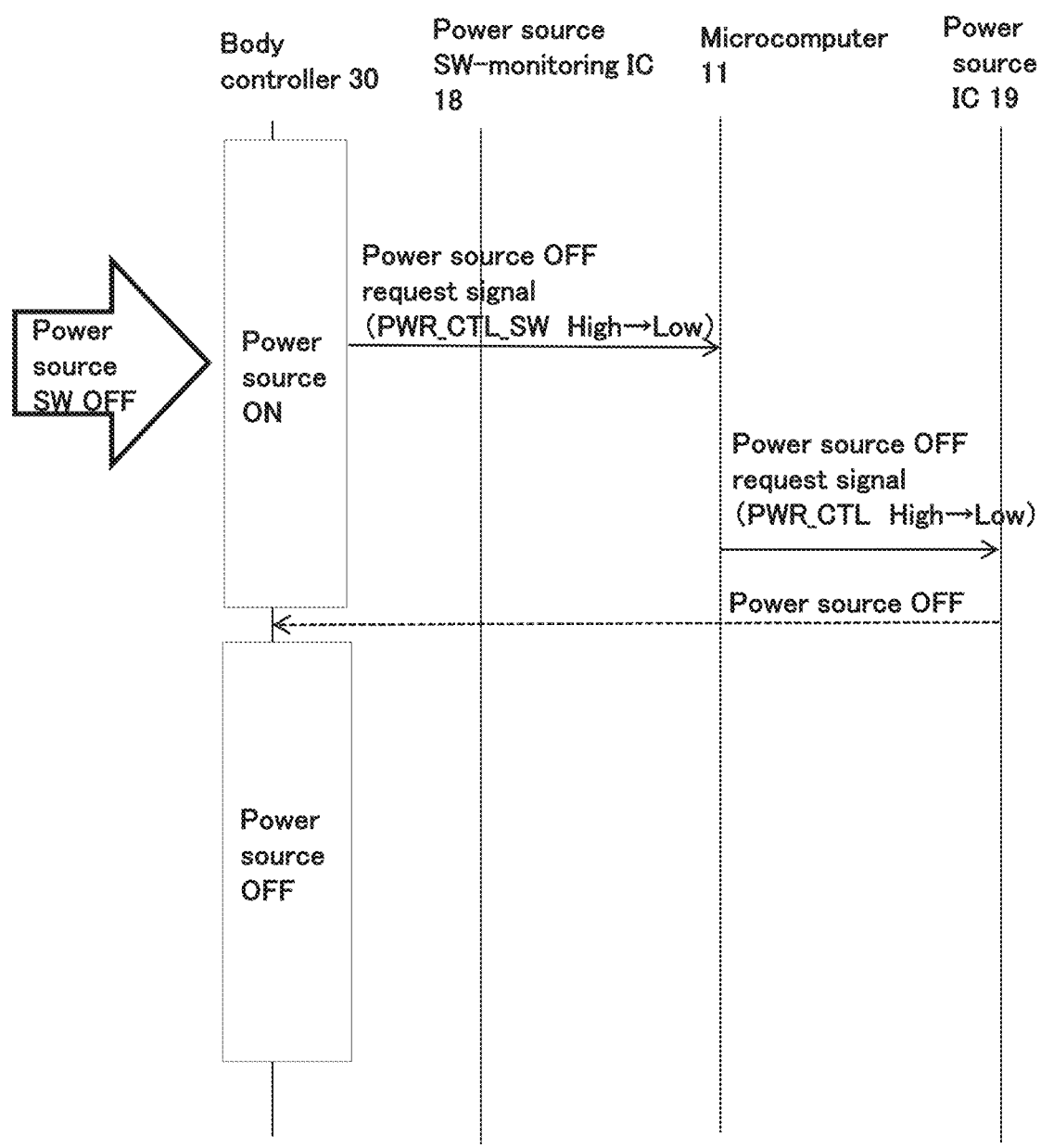
FIG. 7 is a diagram of a control flow for setting the source of the imaging device to OFF.

When the power source switch is turned from ON to OFF, the actuating body controller 30 detects that the power source switch has been turned OFF and transmits a power source OFF request signal to the microcomputer 11, as shown in FIG. 7. The microcomputer 11 transmits the power source OFF request signal to the power source IC 19, and the power source IC 19 turns OFF the power source of the imaging device 1.

According to the example shown in FIG. 2, even when the battery 20 is not fitted, the main functions of the imaging device 1 can be carried out by means of the power supply from the connected device, which is a USB PD-compliant device. However, when the battery 20 is not fitted and the USB cable is pulled out while a main function of the imaging device 1 is being carried out, the main function of the imaging device 1 stops because the power supply is cut off. There is a risk that the user will pull out the USB cable while a main function is being carried out because it is conceivable that the user would use the imaging device 1 without being aware of whether or not the battery 20 is fitted in. At this time, the imaging device 1 is susceptible to having data be damaged if recording on a medium is taking place, and is also susceptible to a fault occurring in a program and the body controller 30 being unable to start up if a firmware update for the body controller 30 is taking place.

As described above, when the connected device is a USB PD-compliant device, it is possible to supply power equal to or greater than the power consumed by the imaging device 1 during driving. FIG. 3 shows control details, which are carried out by the microcomputer 10, the control details including charging of the battery and/or power delivery to the imaging device 1 (equivalent to drive power for carrying out the main functions of the imaging device 1), according to devices connected by USB.

I. When Connected Device is USB PD-Compliant Device

In the case of a USB PD-compliant device, charging can be performed in addition to power delivery for the drive power for the imaging device 1 because power equal to or greater than the power consumption of the imaging device 1 can be supplied.

I-A. When Power Source Switch of Imaging Device is OFF

When the connected device is a PC or an AC adapter, charging is performed when the battery 20 is fitted in the imaging device 1, and charging is not performed when the battery 20 is not fitted in.

I-B. When Power Source Switch of Imaging Device is ON

When the connected device is a PC and a battery is fitted in, charging with the excess power is performed in addition to a MASS connection or a PTP connection and the delivery of drive power for the imaging device 1. A MASS connection is a connection for transferring large-volume data of an SD card, etc. A PTP connection is a connection for transferring image data.

When the connected device is an AC adapter, charging with the excess power is performed in addition to the delivery of power when the battery is fitted in.

When the battery is not fitted in, even if the connected device is a PC or an AC adapter, the power source switch of the imaging device 1 is not turned ON as is described hereinafter, and neither power delivery nor charging is performed.

II. When Connected Device is Non-USB PD-Compliant Device

When the connected device is not a USB PD-compliant device, power sufficient to carry out both charging and power delivery can not be obtained. Consequently, charging is performed only when the power source switch of the imaging device is OFF. Specifically, the following is carried out.

II-A. When Power Source Switch of Imaging Device is OFF

When the connected device is a PC or an AC adapter, charging is performed when the battery 20 is fitted in the imaging device 1, and charging is not performed when the battery 20 is not fitted in.

II-B. When Power Source Switch of Imaging Device is ON

When the connected device is a PC, only a MASS connection or a PTP connection and power delivery are performed.

When the connected device is an AC adapter, only power delivery is performed.

When the battery is not fitted in, power delivery is not performed even if the connected device is a PC or an AC adapter.

Consequently, to avoid the risk that the power supply will be cut off and driving of the imaging device 1 will stop while a main function of the imaging device 1 is being carried out, in the imaging device 1 according to the present embodiment, the following countermeasure is performed so that the main functions of the imaging device 1 are not activated by power from the USB port 16 when the battery 20 is not fitted in the imaging device 1. In other words, in the present embodiment, a process shown in FIG. 4 is carried out so that power supply to the imaging device 1 is safely executed.

Figure 4:
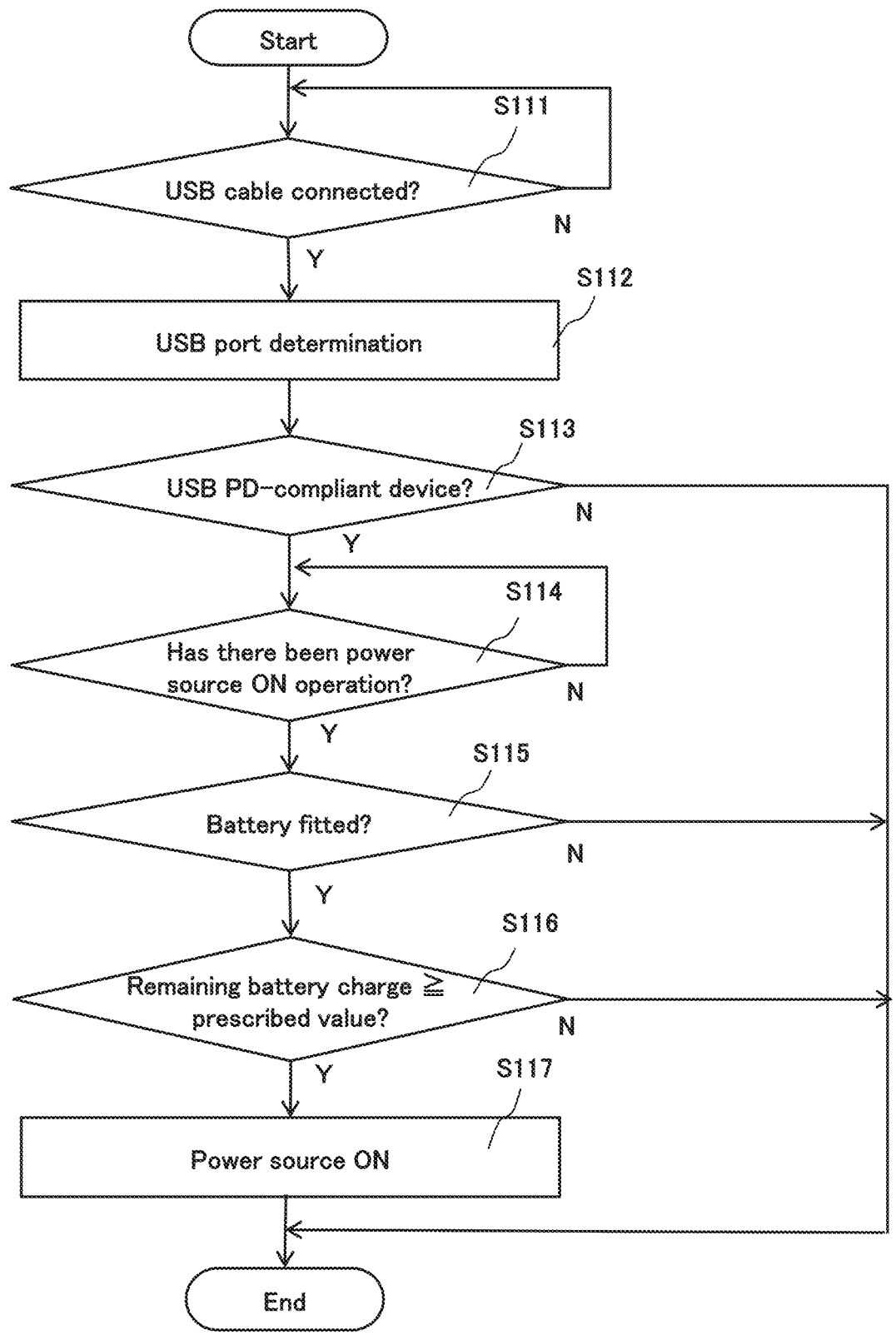
FIG. 4 is a flowchart of actions of the imaging device according to Embodiment 1.

FIG. 4 is a flowchart showing the startup action of the body controller 30 according to Embodiment 1.

Steps S111 and S112 shown in FIG. 4 are similar to steps S101 and S102 shown in FIG. 2 and are therefore not described.

Figure 5:
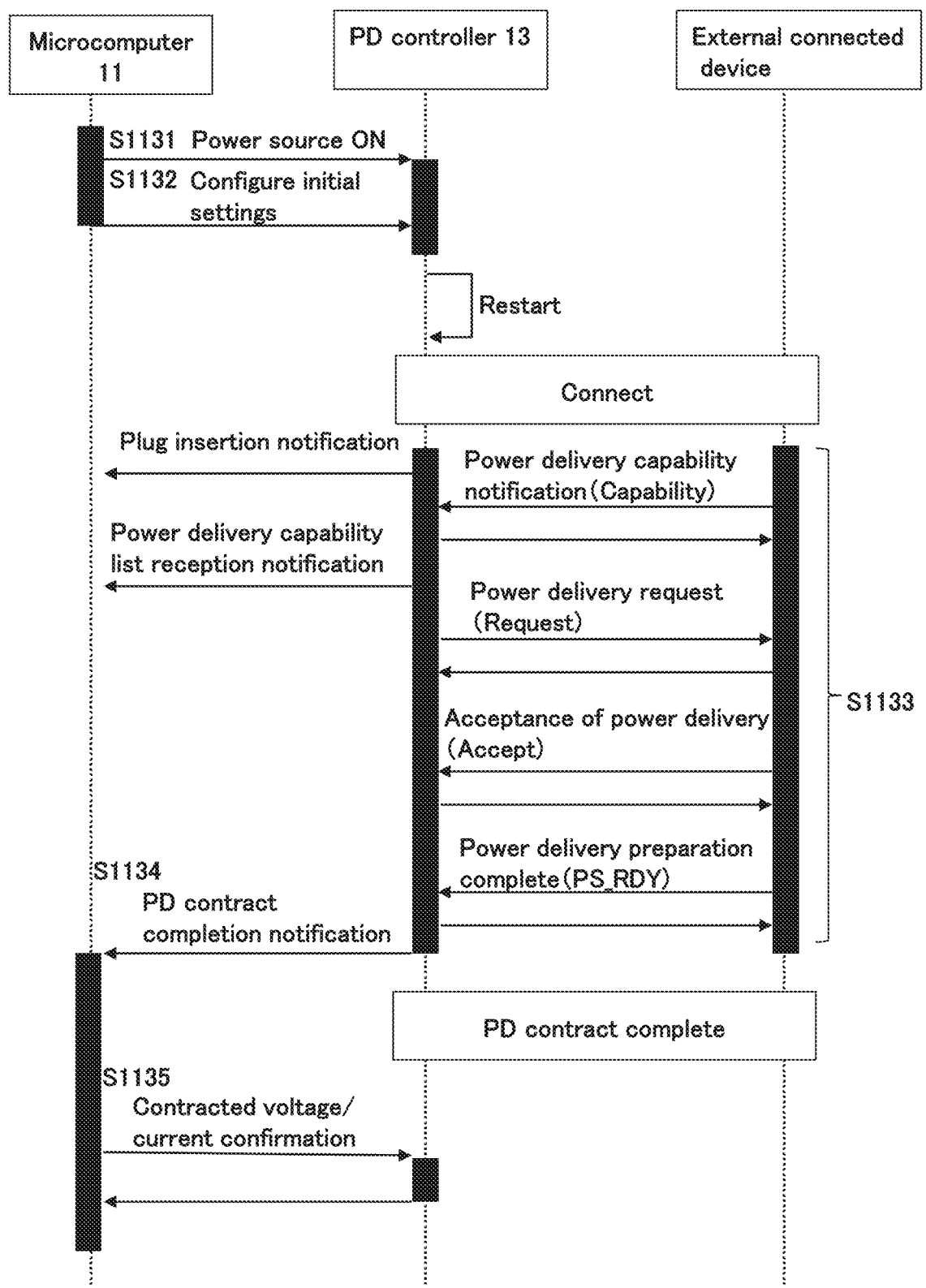
FIG. 5 is a diagram of a flow of actions of a negotiation during a USB connection.

As in the example (step S103) shown in FIG. 2, the microcomputer 11 detects whether or not the connected device is a USB PD-compliant device through negotiations with the connected device (S113). FIG. 5 is referenced here to describe negotiations, made via the CC terminal, for detecting that the connected device is a USB PD-compliant device.

First, the microcomputer 11 applies a power source to the PD controller 13 through power source control (S1311: control power source ON). Next, the microcomputer 11 implements the requested power/current settings in the PD controller 13 (S1132: initial settings configured). After the initial settings have been configured, the PD controller 13 restarts, and according to a setting value set in S1132, connects to the connected device and initiates the negotiations (S1133). At this time, the PD controller 13 notifies the microcomputer 11 that a plug of a USB cable has been inserted into the USB port 16. In the negotiations, notification of a power delivery capability is given from the connected device to the PD controller 13. At this time, the PD controller 13 issues a notification to the microcomputer 11 stating that a power delivery capability list has been received. By receiving this notification, the microcomputer 11 determines whether or not the connected device is a USB PD-compliant device. The PD controller 13 then issues a power delivery request to the connected device. Having received this request, the connected device notifies the PD controller 13 of an acceptance of the power delivery request and also of a completion of a power delivery preparation.

The PD controller 13 notifies the microcomputer 11 that a "PD contract" including the above-described power delivery condition has been completed (S1134), and the PD contract is completed. The microcomputer 11 gives the PD controller 13 confirmation of the voltage and current set in the PD contract (S1135).

In FIG. 4, when the connected device is detected to be a USB PD-compliant device as a result of the negotiations described above, the process advances to step S114, and when the connected device is not a USB PD-compliant device, the process is ended.

When the connected device is not a USB PD-compliant device and the battery 20 is fitted in the imaging device 1, startup of the body controller 30 may be enabled in accordance with the ON operation of the power source switch. When the power source switch has been operated to ON, the power supplied from the connected device is small; therefore, activation of the main functions of the imaging device 1 may be enabled, whereas charging of the battery 20 is be prohibited.

In accordance with the determination result of step S113, the microcomputer 11 may cause the status liquid-crystal monitor 15 to display information and/or a message indicating whether or not the connected device is a USB PD-compliant device. By knowing whether or not the connected device is a USB PD-compliant device, the user can ascertain whether or not power is being supplied by USB PD.

Next, when the power source switch-monitoring IC 18 detects that the power source switch has been operated to ON (Yes in S114), the IC 18 transmits a power source ON request signal to the microcomputer 11. The microcomputer 11 determines whether or not the battery 20 is fitted in the imaging device 1 (S115). Specifically, the microcomputer 11 senses through the power source IC 19 a signal (High signal or Low signal) generated in response to fitting and removing the battery 20, and determines whether or not the battery 20 is fitted in.

When the battery 20 is fitted in, the process advances to step S116. When the battery 20 is not fitted in, the microcomputer 11 invalidates the power source ON request signal, thereby maintaining the OFF state without turning ON the power source of the imaging device 1.

When the battery 20 is fitted in, the microcomputer 11 determines whether or not the remaining charge of the battery 20 is equal to or greater than a prescribed amount, i.e., whether or not there is sufficient remaining charge for the main functions of the imaging device 1 to be carried out with the actions of the body controller 30 (S116). For example, the power source IC 19 acquires a voltage at both ends of the battery 20, and acquires the remaining charge of the battery 20 in accordance with this voltage. The microcomputer 11 compares a prescribed value and the remaining charge of the battery 20 detected via the power source IC 19. This prescribed value is a lower limit value of remaining battery charge sufficient to carry out the main functions of the imaging device 1. Upon determining that the remaining charge of the battery 20 is equal to or greater than the prescribed value (Yes in S116), the microcomputer 11 transmits the power source ON request signal to the power source IC 19, turns ON the power source of the imaging device 1, and starts up the body controller 30 (S117). As a result, the main functions of the imaging device 1 can be carried out, and both power delivery for the drive power of the imaging device 1 and charging of the battery 20 can be performed through the power from the connected device. The amount of power that can be used to charge the battery 20 differs because the power consumption differs depending on the actuating mode of the imaging device 1. In this case, a setting may be implemented so that regardless of power consumption, a fixed amount of power is used to charge the battery.

When the remaining charge of the battery 20 is determined to be less than the prescribed value (No in S116), the microcomputer 11 invalidates the power source ON request signal, thereby maintaining the OFF state without turning ON the power source of the imaging device 1.

[1-3. Effects]

The imaging device 1 according to Embodiment 1 above is an imaging device in and from which a battery 20 can be fitted and removed, the imaging device 1 comprising a CMOS image sensor 37, a USB port 16, and a microcomputer 11. The CMOS image sensor 37 images a subject. The USB port 16 supplies power to the imaging device 1 via a USB cable. The microcomputer 11 detects whether or not the battery 20 has been fitted in the imaging device 1. The microcomputer 11 enables an action of the CMOS image sensor 37 by means of the power from the USB port 16 when the battery 20 has been fitted in the imaging device 1. The microcomputer 11 disables the action of the CMOS image sensor 37 by means of the power from the USB port 16 when the battery 20 has not been fitted in the imaging device 1.

The microcomputer 11 also detects the remaining charge of the battery 20, and starts up the body controller 30 by means of the power from the USB port 16 only when the remaining charge of the battery 20 is sufficient for the actions of the main functions of the imaging device 1 performed by the control of the body controller 30.

Therefore, even when the USB cable is pulled out while a main function of the imaging device 1 is being carried out, it is possible, due to the power from the battery 20, to maintain a state in which a main function of the imaging device 1 can be carried out. Therefore, it is possible to prevent problems incurred due to the power supply being cut off, e.g., data being damaged during recording of an image in media, an update of firmware of the body controller 30 stopping partway through and a fault occurring in a program, etc. Consequently, the imaging device 1 can safely receive a supply of power.

2. Embodiment 2

Figure 8:
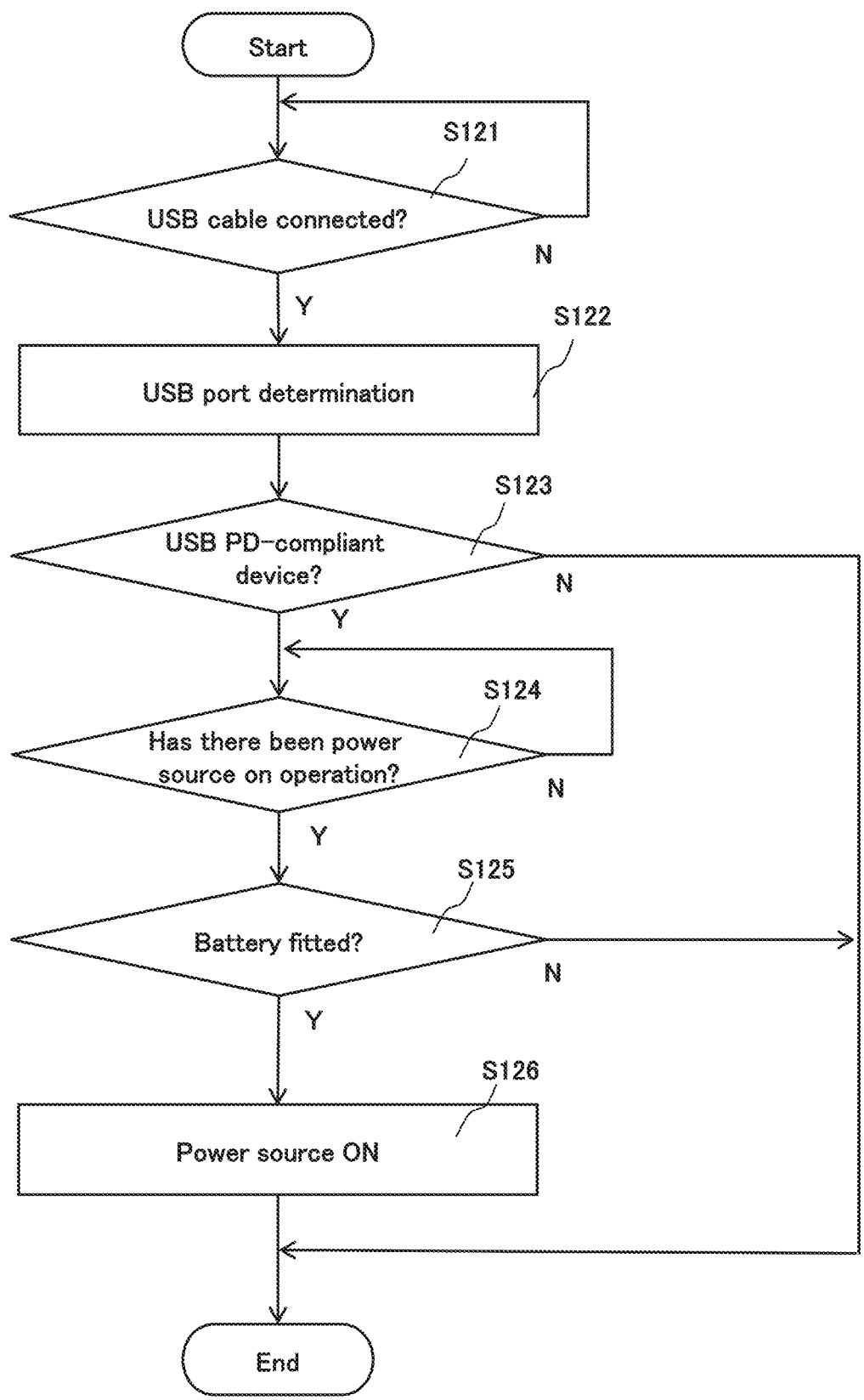
FIG. 8 is a flowchart of actions of an imaging device according to Embodiment 2.

FIG. 8 is a flowchart of a startup action of the body controller 30 according to Embodiment 2. The configuration of the imaging device according to the present embodiment is similar to the configuration of the imaging device 1 shown in FIG. 1, and is therefore not described.

In Embodiment 1, the power source of the imaging device 1 is turned ON only when the battery is fitted in and the remaining battery charge is sufficient, as shown in FIG. 4 (steps S114 to S117 of FIG. 4). However, in Embodiment 2, the determination of the remaining battery charge can be omitted, as below.

Steps S121, S122, S123, and S124 shown in FIG. 8 are similar to steps S111, S112, S113, and S114 shown in FIG. 4 and are therefore not described.

As in step S115 of FIG. 4, the microcomputer 11 determines whether or not the battery 20 has been fitted in the imaging device 1 (S125), and when the battery has been fitted in, the microcomputer transmits a power source ON request signal to the power source IC 19, turns ON the power source of the imaging device 1, starts up the body controller 30, and enables the main functions of the imaging device 1 to activate (S126).

After the above, the remaining charge of the battery 20 may be detected by the microcomputer 11, and the body controller 30 may cause the remaining charge of the battery 20 to be displayed on the liquid crystal monitor 35. In this case, when the remaining charge of the battery 20 falls below a prescribed amount (remaining charge sufficient to carry out the main functions of the imaging device 1), a warning to not pull out the USB cable before the battery 20 is charged may be outputted. Unintentional cutting off of the power supply can be prevented by giving the user a warning about pulling out the USB cable.

3. Other Embodiments

Embodiments were described above as examples of the technology disclosed in the present application. However, these embodiments are not provided by way of limitation as to the technology in the present disclosure; this technology can also be applied as appropriate to embodiments in which changes, replacements, additions, omissions, etc., have been made. The constituent elements described in the above embodiments can also be combined to yield new embodiments.

(1) In the above embodiments, an integrated-lens digital camera was used as an example of the imaging device 1, but the device may also be a replaceable-lens camera. The imaging device 1 may be a device having an imaging function, such as a smartphone or another portable terminal.

(2) In the imaging device 1, the liquid crystal monitor 35 may be made to display information indicating whether or not the connected device is a USB PD-compliant device after the power source has been turned ON. This information may be displayed by text, icons, etc.

(3) In the example of FIG. 3, when the connected device is a Non-USB PD-compliant device and the battery 20 has been fitted in the imaging device 1, the battery 20 is charged when the power source is OFF, and only power delivery to the imaging device 1 is carried out when the power source is ON. In this case, the liquid crystal monitor 35 may display a message prompting to turn the power source from ON to OFF for a user wishing to charge the battery 20.

(4) During a state in which the actions of the main functions of the imaging device 1 can be performed by means of power from the USB port 16, the microcomputer 11 may give a warning upon sensing that the battery 20 has been taken out. This report may be, for example, displayed on the liquid crystal monitor 35 and/or the status liquid-crystal monitor 15, or outputted by audio from a speaker or another audio output unit (not shown).

(5) The sequence by which the process method in the above embodiments is carried out is not necessarily limited to what is written in the above embodiments; the sequence may be replaced or a plurality of processes may be carried out simultaneously within a range that does not deviate from the scope of the invention.

The computer program described above is not limited to being recorded on the recording medium described above; the computer program may be acquired via an electric communication circuit, a wireless or wired communication circuit, networks typified by the internet, etc.

As above, embodiments were described as examples of the technology in the present disclosure. The accompanying drawings and the detailed description were submitted for this purpose. Therefore, the constituent elements presented in the accompanying drawings and the detailed description may include not only the constituent elements essential to solving the problems, but also, constituent elements that are not essential to solving the problems, in order to exemplify the technology described above. Therefore, with these inessential constituent elements being presented in the accompanying drawings and detailed description, there is no need to immediately accredit these inessential constituent elements as being essential.

The embodiments described above are intended to exemplify the technology in the present disclosure, and various changes, replacements, additions, omissions, etc., can be made within a range of the claims or a range equivalent to the claims.

INDUSTRIAL APPLICABILITY

The present disclosure can be applied to a digital camera, a movie camera, a portable phone with a camera, and other electronic devices provided with an imaging function.

KEY

1: Imaging device
11: Microcomputer
12: Charging IC
13: PD controller
15: Status liquid-crystal monitor
16: USB port
17: Analog switch
18: Power source switch-monitoring IC
19: Power source IC
20: Battery
30: Body controller
31: Image processor
32: DRAM
33: Operation unit
34: Flash memory
35: Liquid crystal monitor
36: Wireless communication unit
37: CMOS image sensor
40: Memory card
50: Optical system

CITATION LIST

Patent Literature

Patent Literature 1: Japanese Laid-open Patent Publication No. 2013-80392

The invention claimed is:

1. An imaging device in and from which a battery can be fitted and removed, the imaging device comprising:
an imaging sensor configured to image a subject;
a power supply terminal configured to supply power to the imaging device via a USB cable; and a controller configured to detect whether or not the battery has been fitted in the imaging device, the controller configured to:

detect whether or not an external device connected to the USB cable is a USB PD-compliant device; and in case the external device is a USB PD-compliant device, (i) enable an action of the imaging sensor by means of the power from the power supply terminal when the battery is fitted in the imaging device, and (ii) disable the action of the imaging sensor that rely on the power from the power supply terminal when the battery is not fitted in the imaging device, the disabling of the action of the imaging sensor including disabling imaging still images.

2. The imaging device as recited in claim 1, wherein the controller is configured to detect a remaining charge of the battery when the battery is fitted in the imaging device, and enable the action of the imaging sensor by means of the power from the power supply terminal only when the remaining charge of the battery is sufficient for the action of the imaging device.

3. The imaging device as recited in claim 1, wherein the controller is configured to enable the action of the imaging sensor that rely on the power from the power supply terminal and prohibit charging of the battery when the external device connected to the USB cable is not a USB PD-compliant device and the battery is fitted in the imaging device.

4. The imaging device as recited in claim 1, comprising a display unit configured to display information in accordance with a command of the controller, the display unit configured to display information indicating whether or not an external device connected to the USB cable is a USB PD-compliant device.

5. The imaging device as recited in claim 1, wherein the controller is configured to give a warning upon sensing that the battery is taken out when the action of the imaging sensor is being performed by means of the power from the power supply terminal.

6. The imaging device as recited in claim 1, wherein the controller is configured to enable the action of the imaging sensor by turning ON power source when the battery is fitted in the imaging device.

7. The imaging device as recited in claim 1, wherein the controller is configured to:

(iii) enable the action of the imaging sensor and prohibit charging of the battery in case of a power switch of the image device being ON, when the external device connected to the USB cable is not a USB PD-compliant device and the battery is fitted in the imaging device; and (iv) enable the action of the imaging sensor and allow charging of the battery in case of the power switch of the image device being ON, when the external device connected to the USB cable is a USB PD-compliant device and the battery is fitted in the imaging device.

8. An imaging device in and from which a battery can be fitted and removed, the imaging device comprising:

an imaging sensor configured to image a subject;

a power supply terminal configured to supply power to the imaging device via a USB cable; and a controller configured to detect whether or not the battery has been fitted in the imaging device, the controller configured to:

(i) enable an action of the imaging sensor by means of the power from the power supply terminal when the battery is fitted in the imaging device, and (ii) disable the action of the imaging sensor that rely on the power from the power supply terminal when the battery is not fitted in the imaging device, the disabling of the action of the imaging sensor including disabling imaging still images.

9. The imaging device as recited in claim 8, wherein the controller is configured to detect a remaining charge of the battery when the battery is fitted in the imaging device, and enable the action of the imaging sensor by means of the power from the power supply terminal only when the remaining charge of the battery is sufficient for the action of the imaging device.

10. The imaging device as recited in claim 8, wherein the controller is configured to give a warning upon sensing that the battery is taken out when the action of the imaging sensor is being performed by means of the power from the power supply terminal.

11. The imaging device as recited in claim 8, wherein the controller is configured to enable the action of the imaging sensor by turning ON power source when the battery is fitted in the imaging device.

* * * * *